United States Patent [19]
Choudhury et al.

[11] Patent Number: 6,027,563
[45] Date of Patent: Feb. 22, 2000

[54] METHOD AND APPARATUS FOR THE ORIENTED SOLIDIFICATION OF MOLTEN SILICON TO FORM AN INGOT IN A BOTTOMLESS CRYSTALLIZATION CHAMBER

[75] Inventors: Alok Choudhury, Puttlingen; Matthias Blum, Büdingen; Harald Scholz, Frankfurt am Main; Georg Jarczyk, Grosskrotzenburg, all of Germany

[73] Assignee: Ald Vacuum Technologies GmbH, Germany

[21] Appl. No.: 08/799,133

[22] Filed: Feb. 13, 1997

[30] Foreign Application Priority Data

Feb. 24, 1996 [DE] Germany .......................... 196 07 098

[51] Int. Cl.$^7$ .................................................. C30B 15/20
[52] U.S. Cl. .............................. 117/18; 117/33; 117/214; 117/216; 117/924
[58] Field of Search ................................ 117/18, 33, 214, 117/216, 924; 264/25

[56] References Cited

U.S. PATENT DOCUMENTS

| | | | |
|---|---|---|---|
| 4,312,700 | 1/1982 | Helmreich et al. | 264/300 |
| 4,572,812 | 2/1986 | Ciszek | 264/486 |
| 4,687,646 | 8/1987 | Mateika et al. | 117/200 |
| 5,211,802 | 5/1993 | Kaneko et al. | 117/49 |
| 5,588,993 | 12/1996 | Holder | 117/13 |

FOREIGN PATENT DOCUMENTS

| | | |
|---|---|---|
| 0021385 | 1/1981 | European Pat. Off. . |
| 0082100 | 6/1983 | European Pat. Off. . |

OTHER PUBLICATIONS

S. Servant et al., "Grain structure of silicon solidified from an inductive cold crucible" (1993).
K. Kaneko et al., "Cold crucible induction casting of semi–conductor silicon", Proceedings of Sixth Int'l Iron & Steel Congress (1990).

*Primary Examiner*—Felisa C. Hiteshew
*Attorney, Agent, or Firm*—Fulbright & Jaworski, LLP

[57] ABSTRACT

For the oriented solidification of molten silicon to form an ingot in a bottomless crystallization chamber (9, 41) with a cooling body (11), which can be lowered relative to the chamber, the flat bottom surface of a seed body (25) of solid silicon is laid on the surface of the cooling body. The top surface of the seed body (25) is melted, and the ingot is grown on top of it as the cooling body is lowered by relative motion with respect to the crystallization chamber (9, 41) at a rate which is dependent on the supply of additional silicon and the solidification rate. For the purpose of producing large ingots with a coarsely crystalline to monocrystalline structure, a seed body (25) with a crystalline structure selected from the group ranging from coarsely crystalline to monocrystalline is used. Either lump silicon is placed on top of the seed body (25) and melted by induction, or molten silicon is produced in a forehearth (37) and poured onto the seed body (25). The seed body (25) has a thickness of 0.3–20 mm, and preferably of 1–10 mm.

21 Claims, 4 Drawing Sheets

METHOD AND APPARATUS FOR THE ORIENTED SOLIDIFICATION OF MOLTEN SILICON TO FORM AN INGOT IN A BOTTOMLESS CRYSTALLIZATION CHAMBER

BACKGROUND OF THE INVENTION

The invention pertains to a method for the oriented solidification of molten silicon to form an ingot in a bottomless crystallization chamber with a cooling body supporting the ingot, the cooling body being lowered by relative motion with respect to the crystallization chamber at a rate dependent on the supply of additional silicon and the solidification rate. The flat surface of a seed body with a columnar crystal structure, which initially at least almost completely closes off the crystallization chamber, is laid on the surface of the cooling body and is superficially melted by the molten silicon. The cooling body supporting the seed body and the already solidified part of the ingot is then removed by relative motion from the crystallization chamber.

Ingots of this type are used as starting material for the production of, for example, photovoltaic elements such as solar cells. For this purpose, the ingots are sliced into extremely thin wafers with a thickness of less than 500 $\mu$m and then subjected to the required further processing. During oriented solidification, either so-called "fringe" crystals (in a columnar arrangement) or monocrystals can be produced. The production of single crystals by the Czochralski method, for example, is thus quite expensive.

Studies have shown that the efficiency with which solar energy is converted to electricity depends very strongly on the microstructure of the silicon. The efficiency of a glassy structure, that is, of amorphous silicon, is extremely low, but it increases with the size or columnar arrangement of the crystals, reaching values of approximately 15% or more in so-called monocrystalline cells. The reason for this behavior is considered to be the presence of impurities at the grain boundaries, which lead to the recombination of charge carriers. These relationships are described in the book by Bergmann and Schaefer entitled Lehrbuch der Experimentalphysik [Textbook of Experimental Physics], Vol. 6, Solids, Verlag Walter de Gruyter, Berlin and New York, 1992, pp. 551–553, so that no further discussion in required here.

U.S. Pat. No. 4,572,812 discloses melting silicon in a square, bottomless, cold crucible, made of vertically arranged, palisade-like, water-cooled bars, surrounded by an induction coil, and drawing solid ingot continuously from the melt in a kind of continuous casting process by a support plate, which draws the ingot down continuously. This support plate consists of graphite, and it is heated by the induction coil. One of the reasons why the plate is heated is to preheat the lump silicon to a temperature sufficient for electric current to flow through it. Once this point has been reached, the silicon can then be heated further by the flow of inductive energy until it has completely melted. The ingot thus produced has a cross section of 25×25 mm$^2$ and a length of 17 cm. Although it is stated that the ingot is intended to have a coarsely crystalline structure, this is a relative statement which offers no indication of the absolute size of the crystals, especially in view of the small ingot cross section. Nor is the orientation of any columnar crystals which may be present disclosed.

From the article by Kaneko et al. entitled "Cold Crucible Induction Casting of Semiconductor Silicon", published in the Proceedings of the Sixth International Iron and Steel Congress, 1990, Nagoya, ISIJ, pp. 254–259, it is known that a silicon melt can be produced in a bottomless, water-cooled, cold crucible and that the ingot being formed can be drawn continuously from the cold crucible. The crucible in question has a square cross section with inside dimensions of 80×80 mm$^2$. The stated efficiency of the energy conversion by the end product is 13.7%.

In cold crucibles of this type, the molten silicon does not become contaminated; specifically, it does not take up any oxygen, especially since the process is carried out under vacuum or under a shielding gas. Because the cold crucible, which is slotted in the axial direction, is heated by induction, the possibility of contact between the molten silicon and the walls of the cold crucible is completely excluded. No details are provided concerning the bottom of the crucible, which can be lowered. Without any special measures, however, the crystals which are formed are thin and columnar, with a small cross sections, which would probably explain the low efficiency given for the end product.

The article by Servant et al. entitled "Grain structure of silicon solidified from an inductive cold crucible", published in Materials Science and Engineering, Vol. A173, 1993, pp. 63–66, furthermore, presents a method of the general type described above in which a silicon bar is inserted into the crucible and melted before the continuous addition of lump silicon begins. Both round and square cold crucibles are disclosed; the round cold crucible is said to have an inside diameter of 102 mm, whereas the square cold crucible is said to have inside dimensions of 60×60 mm$^2$. Concerning crystal structure, it is stated that it is possible to distinguish three zones, namely, an outer quenching zone with very small columnar crystals with diameters of 0.1 mm; a transition zone with a larger grain diameter of 2–3 mm; and a central zone with larger grain diameters of 3–4 mm, or, when direct cooling is used, with diameters of 5–8 mm. Thus the grain size spectrum within the ingot cross section is extremely wide, which is as unsuitable as could be imagined for the production of high-efficiency solar cells. The reason given for this unsuitability is the direction of grain growth: initially, the grains grow in a radial direction from outside to inside, whereas, in the center of the ingot, they grow almost vertically. This difference is attributable to an extremely deep melt pool, the depth of which, in the center, is 0.40–0.42 times the diameter of the ingot. As a result, the boundary between the liquid phase and the solid phase is in the shape of a paraboloid, which is also shown in the drawing. Normally, the grains always grow in the direction normal to the solid/liquid phase boundary.

Specific types of problems are encountered in the attempt to produce ingots of silicon in cold crucibles. These are attributable to the very poor thermal conductivity and lack of coupling between the electrically nonconducting silicon and the inductive heating sources at temperatures below approximately 700° C. The silicon does not become sufficiently coupled inductively to an induction coil until the temperature reaches about 1,000° C. Conventional doping cannot change much in this situation. At these temperatures, however, the silicon is extremely reactive, readily taking up substances with which it comes in contact.

U.S. Pat. No. 4,572,812 also describes problems concerning electrical conductivity. To achieve good electrical conductivity, the first possibility given is to bring a graphite heating rod into contact with the semiconductor material. When this is done, however, the energy is transferred centrally, in an almost pointwise or at best linear manner; this is associated with pronounced overheating, and the heat can dissipate only gradually by thermal conduction through the poorly conductive silicon. The semiconductor material also becomes contaminated with traces of graphite. The second possible solution is to use the bottom plate of graphite as a heating element by coupling it to the induction coil. This is associated right away, however, with two disadvantages. First, precisely during the starting phase, the bottom plate cannot be used to initiate the crystallization process; and, second, if a seed crystal plate were to be laid on the bottom plate, it would melt completely and thus lose its crystal structure, which is vital to the entire drawing process. Finally, the bottom area of the ingot would also be contaminated with traces of graphite in this case, so that part of the ingot would have to be discarded. The semiconductor ingot is said to have a cross section of 25×25 mm$^2$, which is relatively small. The problems of external heating by coupling graphite to the silicon, however, increase as the cross section of the ingot becomes larger, because the thermally affected zone is limited and thus strong radial temperature gradients develop.

It also known, finally, that the silicon melt can be produced in a hot crucible made of quartz. Two disadvantages are associated with this approach: first, oxygen will migrate from the quartz crucible to the molten silicon, which is extremely undesirable; and, second, the quartz crucible will be destroyed Then the silicon solidifies. This destruction is attributable to the fact that silicon has a linear expansion rate of 9.6% at the solidification point, which inevitably leads to the destruction of the quartz crucible. Therefore, it is necessary to use a new quartz crucible for each batch. This means that production costs are extremely high.

EP 0 021 385 A1 of the general type in question describes how a polycrystalline semiconductor rod of silicon, which has solidified with longitudinal orientation, can be produced by a continuous process in an inductively heated crystallization chamber of graphite, which is open at the bottom, that is, in a hot crucible. This rod is supported on a plate-shaped cooling body of graphite. The oriented solidification is brought about by using a plate-shaped seed crystal, which is laid on the cooling body, the horizontal dimensions of the crystal corresponding to the cross-sectional area of the silicon rod. Nothing is stated concerning the cross-sectional areas of the individual columnar crystals. The crystallization chamber, consisting of graphite, serves as a susceptor for the inductive heating power; that is, the heat or melting heat is supplied to the content of the crystallization chamber by the extremely hot chamber or crucible wall in the direction radial to the axis of the silicon rod. To prevent undesirable reactions of the graphite components (crystallization chamber and cooling body) with the silicon, the inside surfaces of these parts must be coated with a protective melt of a material inert with respect to silicon in a thickness of approximately 10–20 μm. This protective melt has high surface tension and must be maintained throughout the drawing process.

The protective melt, the temperature of which must be kept below the melting point of silicon (1,410° C.), should contain preferably calcium fluoride. Calcium and all other alkaline-earth metals, however, are readily soluble in silicon, according to, for example, the reaction:

$SiF_4$ is a gas, some of which leads to the formation of bubbles in the silicon, which is extremely undesirable, while some escapes and reacts with the moisture in the atmosphere to form the extremely toxic compound HF:

The presence of silicon dioxide as slag in the ingot, however, means the end of all semiconductor technology.

A vertical temperature gradient, furthermore, must also be maintained within narrow limits inside the crystallization chamber, so that the silicon rod, as it solidifies inside the crystallization chamber, will not rupture the chamber as a result of its high coefficient of expansion. This gradient is very difficult to control by means of automatic control technology. Because the cooling body, consisting of graphite, can dissipate only relatively small amounts heat in the axial direction, the crystal rod must be cooled by directing jets of cooling gas at it radially from ring nozzles, but this can be done only after the starting phase, i.e., after the phase during which the seed crystal plate is still located inside the crystallization chamber.

During the especially important starting phase, therefore, the axial heat dissipation is very slow, so that columnar crystals (fringe crystals) of relatively small cross section are obtained at the edges and at the ends of the silicon rod; these small crystals then propagate through the silicon rod. Columnar crystals of small cross section, however, lead to end products (solar cells) of poor efficiency. By directing jets of cooling gas against the silicon rod, furthermore, the effect is again produced in ingots of large cross section or large diameter that, because of the poor thermal conductivity of silicon, strong horizontal temperature gradients develop, as a result of which the solid/liquid phase boundary becomes increasingly parabolic—an effect which increases as the rod becomes longer.

As a result, the original orientation of the columnar crystals, namely, the orientation parallel to the axis, is lost again, and extremely small individual crystals are formed. In addition, the atmosphere inside the apparatus is disturbed. According to the examples, the ingot cross sections are limited to 30×30 mm$^2$ or 100×100 mm$^2$.

SUMMARY OF THE INVENTION

According to the invention, it is possible to produce highly pure ingots of silicon of large cross section, consisting of columnar crystals of large cross section which are at least mostly parallel to the axis, so that end products characterized by highly efficient energy conversion can be obtained.

According to a first exemplary embodiment of the method according to the invention:

(a) a cold, metal, slotted, water-cooled crucible is used as the crystallization chamber, which is surrounded by an induction coil;

(b) the molten silicon is first adjusted by radiant heating from above to a temperature at which the molten silicon is coupled by its electrical conductivity directly to the induction coil;

(c) a seed body with a crystal structure selected from the group ranging from coarsely crystalline to monocrystalline is used; and (d) the cooling body is left initially uncooled while the surface of the seed body is being melted, and then the cooling is turned on at least essentially at the same time that the relative motion between the cooling body and the cold crucible begins.

What is achieved by characteristic (a) is that, after the production of an inductive coupling according to characteristic (b), the melt is no longer connected in a thermally conductive manner to the cold crucible, with the result that an excessive amount of heat is not lost by conduction through the cold crucible. Although this effect is known in and of itself, it stands in contrast to the state of the art in the particular field in question, in which a protective melt must be used. Because of the distance between the melt and the cold crucible, furthermore, the simultaneous benefit is obtained that the radial expansion of the ingot cannot damage or destroy the cold crucible.

The radiant heating according to characteristic (b) also contrasts with the state of the art in the field, which teaches that the silicon is melted by contact heating. As a result, the contamination of the melt is prevented.

There is no model of any kind in the state of the art for characteristic (c). The state of the art does not deal in any way with the details of the crystal structure.

Characteristic (d) prevents the seed body from losing its crystal structure during the starting phase. The state of the art is also lacking in any reference to this characteristic. Insofar as the expression "lump silicon" is used below, what is involved is a wide spectrum of particle sizes, ranging from fine powder to coarse particles. It is advantageous, however, to use particles at the lower end of the particle-size spectrum, because coarse particles or chunks are responsible for a pronounced local cooling effect on the molten silicon.

Inductively heated cold crucibles with palisade-like walls are described in the article by A. Gubchenko/Novikov/Choudhury/Hugo entitled "Vacuum Induction and Induction Plasma Furnaces with a Cold Crucible", published in the Proceedings of the Vacuum Metallurgy Conference, 1991, Pittsburgh, USA. Explicit reference is made to this article to facilitate an understanding of the present invention.

As a result of the measure according to the invention by which a seed body with a coarsely crystalline to monocrystalline crystal structure is placed on a cooling body as a support plate, the formation of a very deep melt pool in the middle is prevented from the very beginning, as described in Servant et al. In addition, however, the goal is achieved that the crystals grow in such a way that their axes are almost exclusively if not entirely parallel to the axis of the crucible. Specifically as a result of the coarsely crystalline to monocrystalline crystal structure of the seed body, the ingot is forced to assume a corresponding coarsely crystalline structure as it grows. This coarse crystal structure leads to the desired increase in efficiency. Because of the preferably metallic cooling body, finally, the goal is achieved that a very steep vertical temperature gradient develops, which also affects the direction of grain growth and increases the production rate as well. As a result, it is possible to produce square silicon ingots with a length of 1 m or more and with cross sections of 250×250 mm$^2$ or more. In the case of circular cold crucibles, it is possible to produce ingots of similar length with diameters of 300 mm or more. From this alone it can be seen that, as a result of the measure according to the invention, not only the quality of the product but also the production rate and thus the economy of the process can be drastically increased.

The method according to the invention allows of numerous additional embodiments:

For example, as part of an additional embodiment of the invention, it is especially advantageous for lump silicon to be placed on the seed body at the beginning, for a silicon melt to be produced from the lump silicon by inductive heating under superficial melting of the seed body, and for additional lump silicon to be added continuously to the melt as the ingot grows.

It is also advantageous for the seed body to be located initially in the lower area of the cold crucible, for lump silicon to be preloaded initially onto the seed body in the cold crucible to an extent equivalent to at least 50% of the crucible volume, and for this quantity of silicon to be melted in the cold crucible by induction.

According to a second exemplary embodiment of the method according to the invention:

(a) lump silicon is melted to form a silicon melt in a forehearth by electron-beam heating;

(b) a cold crucible which is closed around its circumference is used as the crystallization chamber;

(c) a seed body of solid silicon with a structure selected from the group ranging from coarsely crystalline to monocrystalline is laid on the cooling body;

(d) from the forehearth, molten silicon is applied to this seed body and fused superficially to it by electron-beam heating, the cooling body being left uncooled initially, the cooling then being activated at least essentially at the same time that the relative motion between the cooling body and the cold crucible begins; and finally in that (e) the seed body is lowered by a relative motion with respect to the cold crucible under continuous resupply of molten silicon from the forehearth and under continuation of the electron-beam heating.

In the method described above, the radiant heating is carried out by means of electron beams, as a result of which the silicon can be heated in an especially uniform manner. There is no precedent whatever in the state of the art for the production of silicon ingots by electron-beam heating.

In this case, the material which is used to load the cold crucible is in liquid form. Because electron-beam heating must be carried out under high vacuum, the silicon is prepurified in the forehearth, which is designed in a manner known in and of itself as a water-cooled copper tank.

It is especially advantageous for the seed body and the cooling body to be located initially in the upper area of the cold crucible, for a thin layer of molten silicon to be poured initially onto the seed body from the forehearth, and for this layer to be heated from above by the electron beam until it fuses with the seed body, whereupon additional silicon melt is added to the cold crucible from the forehearth.

It is also important here for the cooling body to be left uncooled at first as the surface of the seed body is being melted and then for the cooling to be turned on at least essentially at the same time that relative motion between the cooling body and the cold crucible begins.

Delaying the start of the cooling of the cooling body offers the significant advantage that the seed body reaches a relatively high temperature, which guarantees that its surface will be melted effectively. When cooling is finally begun, it is advisable to use a gaseous coolant with good thermal conductivity, at a high flow rate, and possibly under elevated pressure in order to promote the transfer of heat even more. The use of a gaseous coolant offers the advantage here that, when the coolant strikes the hot cooling body, vapor does not form abruptly.

The seed body can have any one of the following origins:

1. A wafer from a single crystal originating as waste from a drawing process by the Czochralski method can be used; in this case, the ingot produced will also be a single crystal.

2. A coarse-grained, polycrystalline wafer from conventional production can be used as the seed body.

3. A monocrystalline or polycrystalline seed body which has been sawn from an ingot from in-house production can be used.

The invention also pertains to a first apparatus for implementing the method according to the invention with a furnace chamber, equipped with a bottomless crystallization chamber for the production of the silicon ingot with oriented solidification and with a device for the continuous vertical drawing of the ingot by relative motion by means of a cooling body with a horizontal upper support surface, this cooling body sealing off horizontally at least most of the inside cross section of the crystallization chamber, on which support surface a plane-parallel seed body of silicon is laid, the surface of which corresponds at least essentially to the cross section of the ingot, the furnace chamber also being equipped with an induction coil, surrounding the crystallization chamber, to heat the ingot material.

An apparatus such as this corresponds to EP 0 021 385 A1 cited above.

According to a first exemplary embodiment of an apparatus according to the invention:

(a) the crystallization chamber is a cold, slotted metal crucible; in that (b) a heating device for heating the surface of the ingot material by radiant energy is provided above the cold crucible; and in that (c) the seed body has a vertical crystal structure selected from the group ranging from coarsely crystalline to monocrystalline.

The invention also pertains to an alternative apparatus for implementing the second exemplary embodiment of the method according to the invention with a furnace chamber, equipped with a bottomless crystallization chamber for producing the silicon ingot with oriented solidification and with a device for the continuous vertical drawing of the ingot by relative motion by means of a cooling body with a horizontal upper support surface, which seals off essentially the entire horizontal inside cross section of the crystallization chamber, on which support surface a plane-parallel seed body of silicon is laid, the surface of which corresponds at least essentially to the cross section of the ingot, the furnace chamber also being equipped with a heating device to heat the ingot material, where a forehearth for melting lump silicon and for holding a batch of molten silicon is provided in the furnace chamber.

An apparatus of this type is again similar to that of EP 0 021 385 A1 (which refers to the forehearth as a "recharging crucible") except that the forehearth of EP 0 021 385 A1 has a bottom opening with a packing rod and is heated by induction.

According to a second exemplary embodiment of an apparatus according to the invention:

(a) the heating device consists of at least one electron-beam gun;

(b) the forehearth has an overflow, the lower edge of which ends above the inside cross section of the crystallization chamber;

(c) the crystallization chamber is a cold crucible, which consists of a hollow metal body with a closed circumference, inside which the cooling body can be raised to a point near the upper edge of the hollow body; and (d) the electron-beam gun, at least one of which is provided, is aimed at the forehearth and at the cold crucible to heat the silicon in the forehearth and in the cold crucible.

Heating by means of electron beams offers special advantages, which will be explained in greater detail below as part of the detailed description.

DETAILED DESCRIPTION OF THE PREFERRED EMBODIMENT

Figure 1:
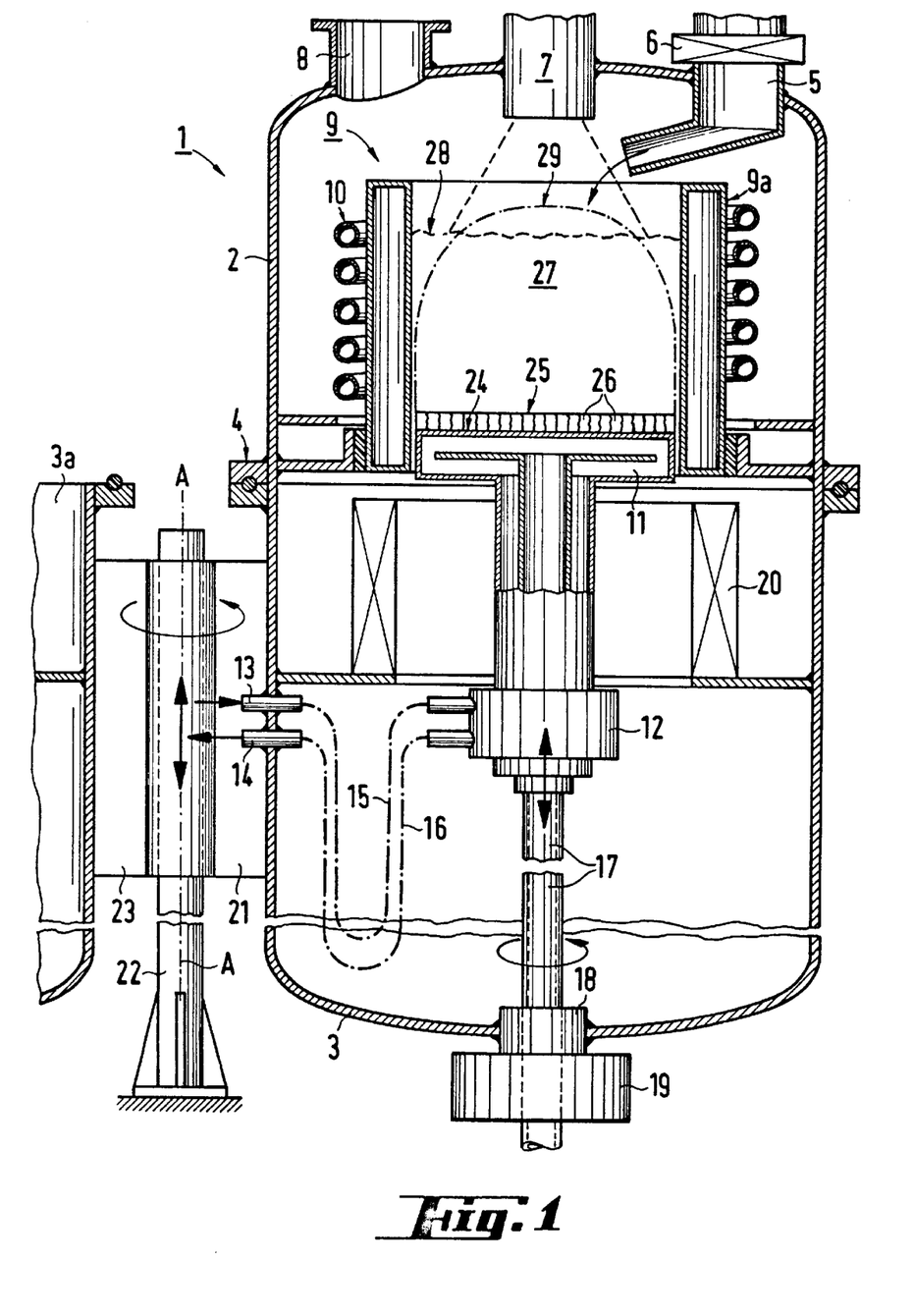
FIG. 1 shows a vertical cross section through an apparatus with an inductively heated cold crucible at the beginning of ingot production.

FIG. 1 shows a furnace chamber 1, which can be operated under vacuum or a shielding gas and which consists of an upper furnace part 2 and a lower furnace part 3. The two furnace parts are connected detachably to each other by a flange connection 4. Shutoff valves, not shown here, can be provided on both sides of flange connection 4 to help maintain the furnace atmosphere.

Upper furnace part 2 is provided with a loading device 5 for lump silicon. Here, too, a shutoff valve 6 can be provided as part of a transfer lock. A first heating device 7 in the form of a radiant heating device is provided in upper furnace part 2 to preheat the lump silicon. A pipe socket 8 serves either to evacuate the chamber or to supply a shielding gas.

A crystallization chamber 9 is also provided in upper furnace part 2, this chamber being designed as a cold crucible 9a, the details of which will be explained in greater detail later on the basis of FIG. 3. Cold crucible 9a is surrounded by an induction coil 10, which is shown only in schematic fashion, and is bottomless. In the starting phase of the apparatus, the lower opening is closed off by a hollow metal cooling body 11, to which the coolant is supplied via a connecting part 12. The connecting part is connected to pipeline pass-throughs 13, 14 by free-hanging hoses 15, 16.

Cooling body 11 can be raised and lowered by means of a threaded spindle 17; the end of threaded spindle 17 is supported rotatably in connecting part 12. Threaded spindle 17 also passes through a spindle nut 18, which simultaneously serves to provide a gas-tight seal. A drive 19, shown only in highly schematic fashion, serves to rotate threaded spindle 17. It is also possible, of course, to attach threaded spindle 17 non-rotatably to connecting part 12 and to cause spindle nut 18 to rotate.

Underneath cold crucible 9a there is a second heating device 20, through which the ingot is conducted during its growth and which serves to prevent the formation of thermal cracks in the extremely brittle silicon. Heating device 20 can consist of a susceptor with an additional induction coil, an induction coil for direct heating, or a resistance heater with appropriate insulation toward the outside. In the simplest case, it is possible to replace this heating device by thermal insulation, which prevents the excessive loss of heat from the ingot by radiation to the cold furnace chamber.

Heating device 20 is located in this case in lower furnace part 3, but this is not absolutely necessary. To achieve a high production rate, lower furnace part 3 is supported so that it can be rotated, raised, and lowered on a stationary column 22, and on the side opposite bracket 21 there is another bracket 23, on which an identical lower furnace part 3a is mounted. As a result, after cooling body 11 containing the finished ingot has been lowered and moved into the position shown in FIG. 2 and after flange connection 4 has been disconnected, lower furnace parts 3, 3a can be exchanged for each other by rotation around axis A—A of column 22, so that, for example, the finished ingot can remain in the (blocked-off) lower furnace part in which it was produced until it has undergone further cooling. As a result, the production speed of the apparatus is considerably increased.

Figure 3:
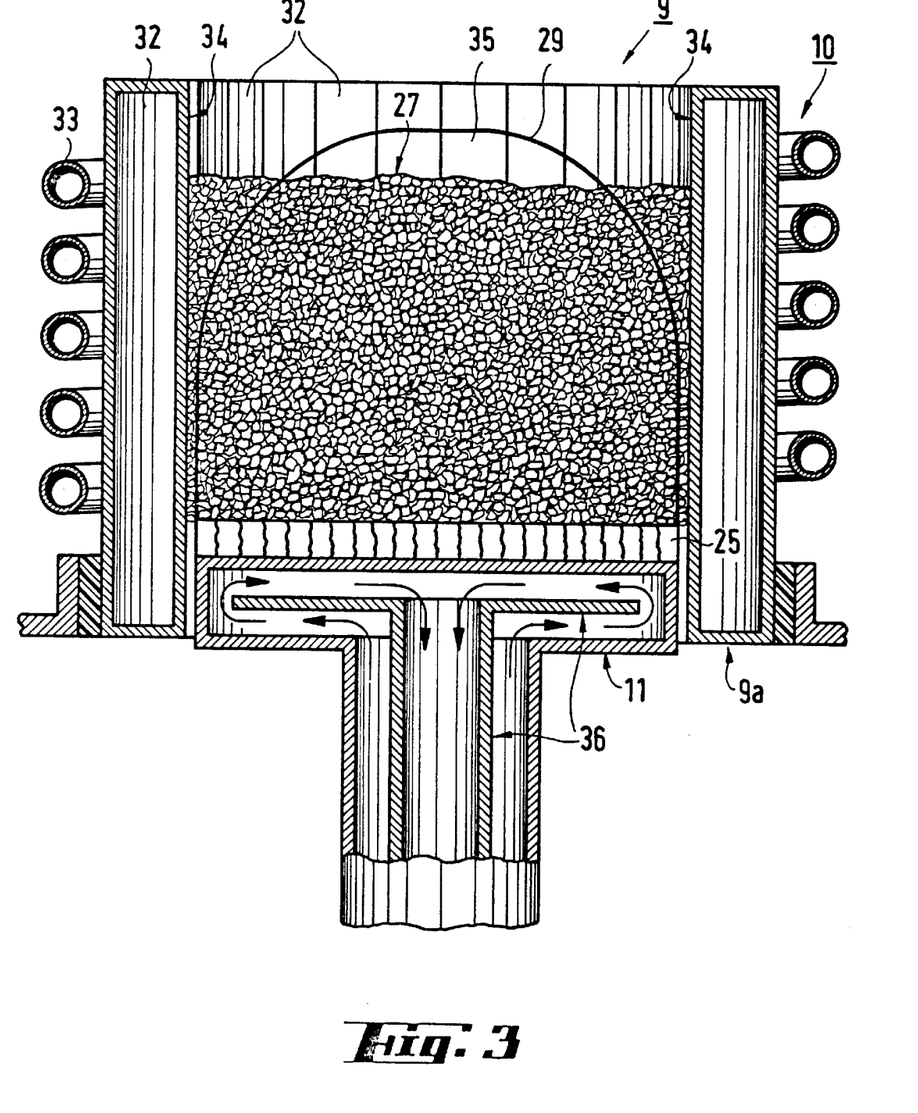
FIG. 3 shows a part of FIG. 1 on an enlarged scale.

According to FIGS. 1 and 3, the flat surface of a seed body 25, bounded by plane-parallel surfaces, is laid on flat surface 24 of cooling body 11; the axially parallel columnar crystals 26 of large cross section or large diameter in the seed body are merely suggested in the drawing. The thickness of seed body 25 is exaggerated in the drawing; it can be made much thinner. A loose pile of particulate silicon 27 is initially loaded onto the seed body by loading device 5, surface 28 of this pile being merely suggested. To produce sufficient electrical conductivity, surface 28 is heated by heating device 27 so that, once a temperature of approximately 700–800° C. is exceeded, induction coil 10 is coupled by way of cold crucible 9a to the lump silicon. It can be seen that cooling body 11 and seed body 25 seal off the bottom opening of cold crucible 9a completely or at least almost completely in cross section, so that neither lump silicon nor the melt formed from it can escape downward and out. As a result of the repelling action of the vertical current flow in the individual sectors of cold crucible 9a, the molten silicon is pushed away from cold crucible 9a increasingly in the upward direction and assumes approximately the form of a paraboloid 29 (see FIG. 3).

The apparatus according to FIG. 1 is now ready for cooling body 11 to be lowered and for an ingot of silicon to be produced continuously.

Figure 2:
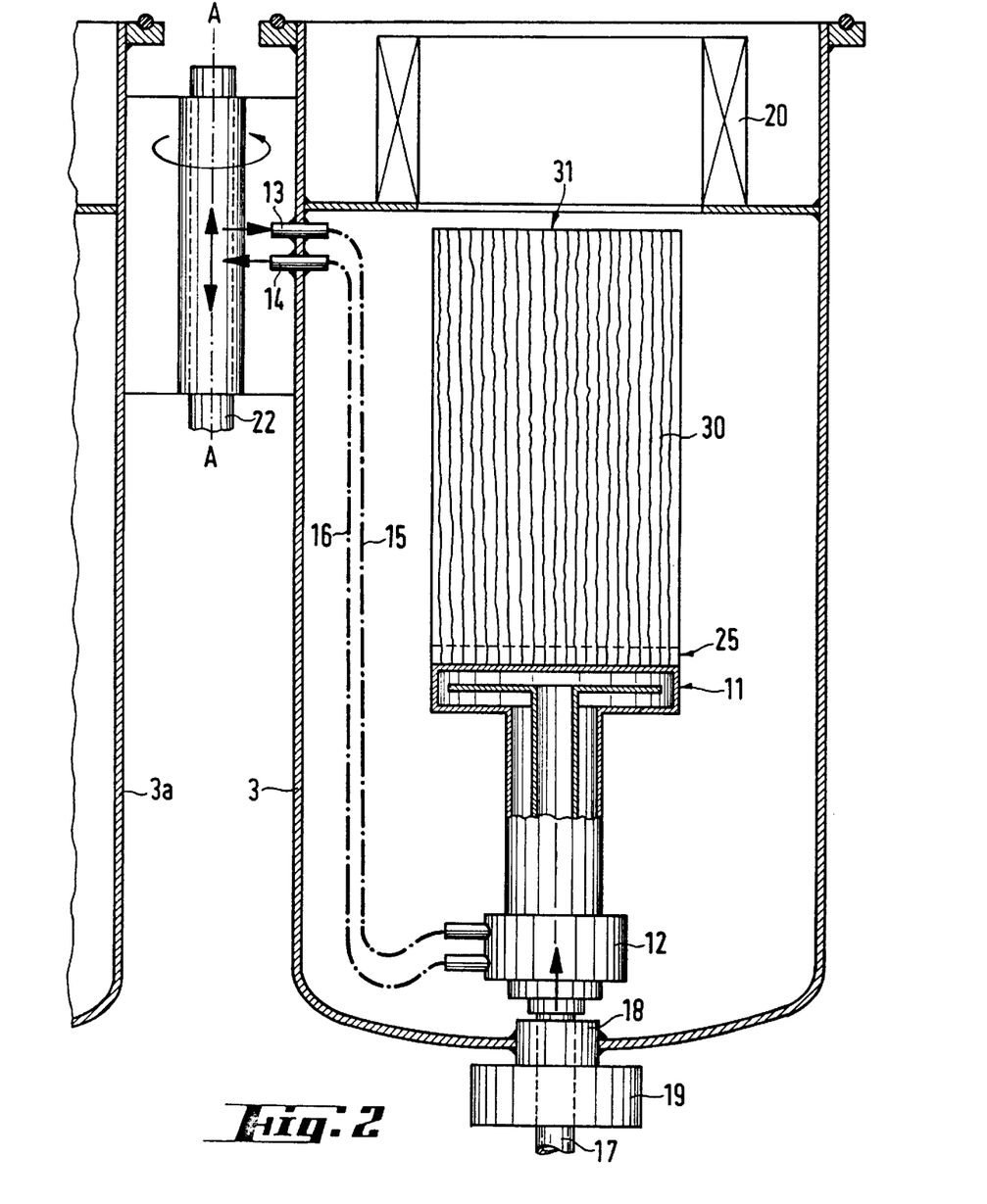
FIG. 2 shows the lower part of FIG. 1 after the ingot has been completed.

In FIG. 2, ingot 30, which has been formed from the molten silicon and which has solidified in an oriented manner, is located in its lowermost position, where top surface 31 is underneath heating device 20. After lower furnace part 3 has been lowered and pivoted around axis A—A of column 22, cooling body 11 containing ingot 30 can be raised so that a gripping device (not shown here) can lift it from cooling body 11. The joint line originally present between seed body 25 and ingot 30 fused to it is merely suggested here in broken line. In rather idealized form, it is shown how the columnar crystals continue all the way to top surface 31, but this is not absolutely necessary, because what is important is the large cross section of the columnar crystals in the silicon wafers formed from the ingot.

It can also be derived from FIG. 3 by way of amplification that cold crucible 9a consists of individual cooling bars 32, the longitudinal axes of which are vertical. The lower ends of these bars surround cooling body 11 like palisades. It is also shown that induction coil 10 consists of individual horizontal windings 33. Cooling bars 32 form a vertically slotted wall 34, but this is impenetrable both to the passage of particulate silicon 27 and to melt 35. After the pile of particulate silicon 27 has been completely melted, the melt acquires paraboloid-shaped envelope surface 29 already described, and, depending on the speed at which cooling body 11 is drawn down, this melt can be replenished at the same rate by the continuous resupply of silicon through loading device 5.

It remains to be pointed out that the relationships between the motion of the components can also be kinematically reversed; that is, it would also be conceivable that a suitable lifting device (not shown here) could be used to raise cold crucible 9a, induction coil 10, and heating device 20. The embodiment shown, however, represents the simpler solution. In cooling body 11 there is also a channel 36 for the coolant, so that it can flow along the path indicated in the arrows in the drawing.

Figure 4:
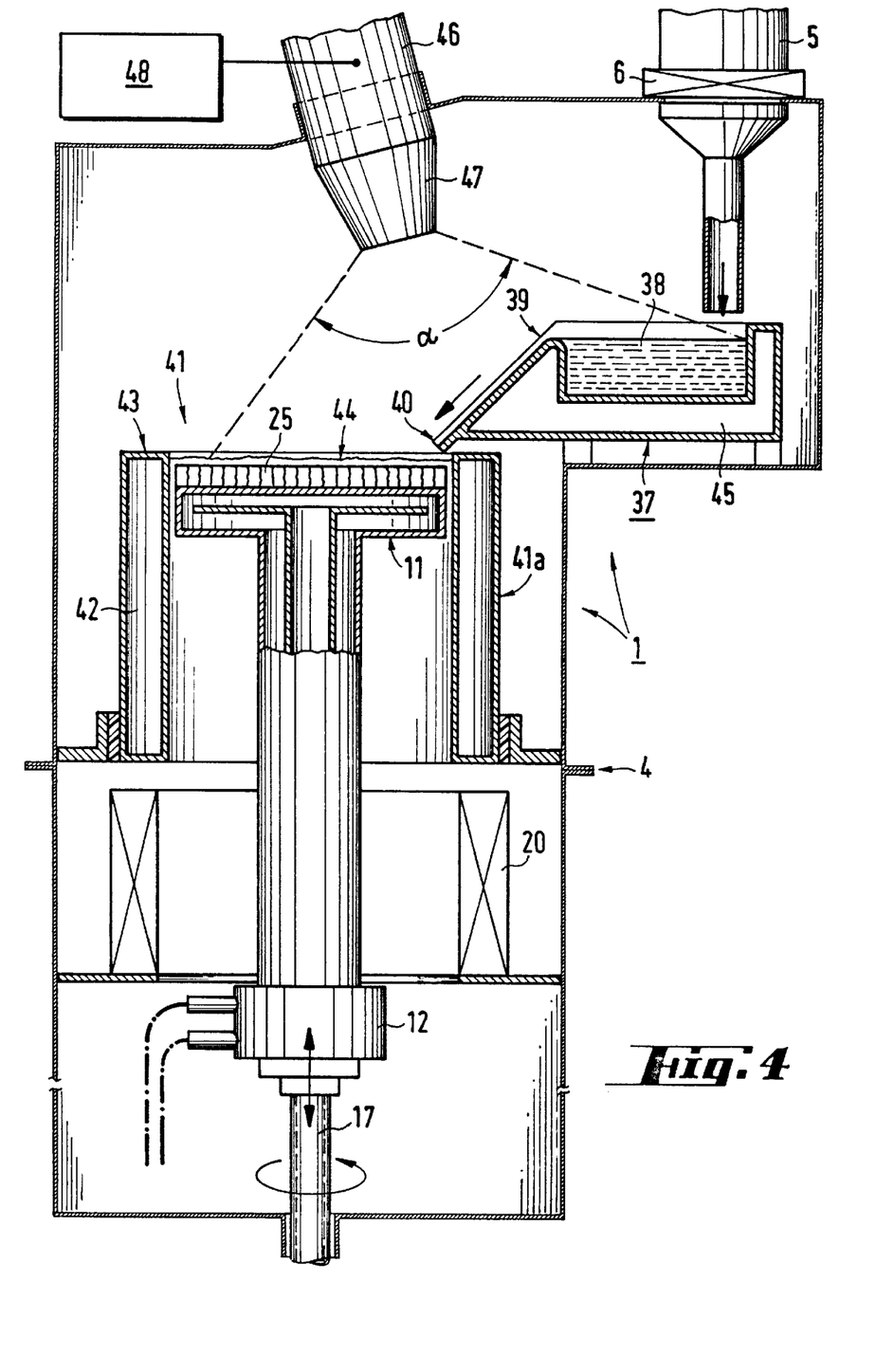
FIG. 4 is a vertical section of a second embodiment wherein the silicon is heated by an electron beam.

FIG. 4 shows only a highly schematic diagram of furnace chamber 1, in which a forehearth 37 for melting lump silicon is provided, which is supplied by means of loading device 5. Forehearth 37 holds a molten batch 38 of silicon. Forehearth 37 has an overflow 39 with a lower edge 40, which ends immediately above the inside cross section of a bottomless crystallization chamber 41, which is designed as a cold crucible 41a. Cold crucible 41a is in this case closed around its circumference and consists of a hollow body 42 of copper. In this case, cooling body 11 with seed body 25 can be raised up to the immediate vicinity of upper edge 43 of cold crucible 41a, as shown in Figure body 25, the discussion presented further above also applies here.

At the beginning of ingot production, a thin layer 44 of molten silicon is applied to the flat top surface of seed body 25 via overflow 39; this layer 44 assumes a pasty to solid consistency. An electron-beam gun 46 is aimed at to forehearth 37, which has the form of a basin and which consists of a water-cooled hollow body 45 of copper; at overflow 39; and at cold crucible 41a. The end of the gun situated inside furnace chamber 1 has a deflecting device 47, by means of which an electron beam or a bundle of rays can be deflected in the direction of the plane of the drawing around an angle α. The beam can also be deflected in the direction perpendicular to the plane of the drawing, so that the entire surface of batch 38, overflow 39, and the melt in cold crucible 41 can be heated by a single electron beam or bundle of rays.

This is done by the use of a deflection controller 48, merely suggested here schematically, by means of which the electron beam can be deflected according to a precisely predetermined pattern in all spatial coordinates and with appropriate hold times, so that batch 38, overflow 39, and cold crucible 41a can be supplied with precisely defined amounts of energy. These conditions are easy to vary during the course of ingot production. Details concerning a deflection controller of this type and the design of electron beam gun 48, are state of the art, so that there is no need for any further discussion of them here. The deflection frequency, however, is set high enough that the thermal inertia of the heated media is sufficient for the heating to assume a more or less steady state.

The electron-beam heating first melts layer 44 again and fuses it to the surface of seed body 25; this is preferably done while the cooling of cooling body 11 is turned off. Then the process of loading melt continuously from forehearth 37 and of drawing of the ingot begins, for which the cooling of cooling body 11 is turned on.

In the method and in the apparatus of FIG. 4, the molten silicon again does not make any contact with oxygen-releasing surfaces. In all cases, care must still be taken to ensure that the inside surfaces of cold crucibles 9a, 41a have a 3-dimensional shape such that the expansion of the silicon at the solidification point is taken into account. The solidification front is usually near the lower end of cold crucibles 9a, 41a. These can have any desired cross-sectional shape (round, square, rectangular, polygonal).

We claim:

1. A method for the oriented solidification of molten silicon to form an ingot in a bottomless slotted cold-wall crucible which is surrounded by an induction coil, having a supporting body which bears the ingot and which is removed from the cold-wall crucible with the already solidified part of the ingot by a relative movement in proportion to further silicon feed and solidification rate, the silicon being adjusted to a temperature at which it is indictively heated by its electrical conductivity, wherein (a) on the hollow metal supporting body configured as a cooling body, a seed body initially at least largely closing the cold-wall crucible and having an axially parallel crystal structure from the coarsely crystalline to monocrystalline group is placed with broad-surface contact and is superficially melted by the molten silicon, (b) a preloaded amount of lump silicon is preheated from above by radiation heating until a sufficient electrical conductivity is reached, and (c) the cooling body is left at first uncooled during the superficial melting of the seed body and the cooling is turned on at substantially the same time as the relative movement between the cooling body and the cold-wall crucible, whereby, due to the coarsely crystalline to monocrystalline crystal structure of the seed body an axially parallel corresponding crystal structure is forced upon the ingot being built up which consists of monocrystalline to columnar crystals of large cross section and diameter.

2. The method according to claim 1, wherein additional lump silicon is steadily fed into the silicon melt during the ingot build-up.

3. The method according to claim 2, wherein the seed body is first disposed in the bottom area of the cold-wall crucible and the latter is preloaded with the lump silicon above the seed body at first up to at least 50% of the crucible capacity, this amount of silicon is indictively melted in the cold-wall crucible.

4. The method of claim 1, wherein a curt seed body defined by plane-parallel surfaces is used, wherein the average diameter of the rod crystals inside of the entire upper intersection surface of the seed body is to at least 10 mm.

5. The method of claim 1, wherein said seed body has a thickness between 0.3 and 20 mm.

6. The method of claim 1, wherein a gaseous coolant is used for cooling the cooling body.

7. Apparatus for the practice of the method of claim 1, having a furnace chamber in which are disposed a bottomless, slotted cold-wall crucible surrounded by an induction coil for the production of the directedly solidified ingot of silicon, a system for the continuous vertical drawing down of the ingot by means of a relative movement through a supporting body at least substantially closing off the horizontal inside cross section of the cold-wall crucible which corresponds at least largely to the ingot cross section, wherein a) the supporting body is configured as a hollow metal cooling body, b) a heating device is disposed above the cold-wall crucible for a surface heating of the ingot material by radiant energy, c) a seed body with an axially parallel crystal structure from the coarsely crystalline to monocrystalline group is placed on the cooling body.

8. Apparatus according to claim 7, wherein said at least one electron beam gun is equipped with a deflection control for the electron beam, by which a quasi-simultaneous proportional heating of the silicon in the forehearth, in the overflow and in the cold-wall crucible can be performed according to a surface distribution pattern with corresponding relative dwell periods.

9. A method for the directed solidification of a melt of silicon to an ingot in a bottomless cold-wall crucible closed on the circumference, with a supporting body bearing the ingot and being lowered with a relative motion with respect to the cold-wall crucible as additional silicon is fed and the solidification rate is lowered by a relative motion with respect to the cold-wall crucible wherein a) on the hollow metal supporting body configured as a cooling body, a seed body initially at least largely closing the cold-wall crucible and having an axially parallel crystal structure from the coarsely crystalline to monocrystalline group is with broad-surface contact and is superficially melted by the molten silicon, b) lump silicon is melted in a forehearth by electron beam heating to a molten silicon that c) molten silicon from the forehearth is applied by electron radiation onto the seed body with superficial fusion with the seed body and the cooling is started at substantially the same time as the relative motion between the cooling body and the cold-wall crucible, and thereupon d) the seed body is lowered, with continual feeding of molten silicon from the forehearth and continuation of the heating by electron radiation, with a relative movement with respect to the cold-wall crucible, by which due to the coarsely crystalline to monocrystalline crystal structure of the seed body an axially parallel, corresponding crystal structure is forced upon the ingot under construction, which consists of the group of monocrystalline to rod crystals of large cross section and diameter.

10. The method of claim 9, wherein a curt seed body defined by plane-parallel surfaces is used, wherein the average diameter of the rod crystals inside of the entire upper intersection surface of the seed body is to at least 10 mm.

11. The method of claim 9, wherein said seed body has a thickness between 0.3 and 20 mm.

12. The method of claim 9, wherein a gaseous coolant is used for cooling the cooling body.

13. Apparatus for the practice of the method of claim 9, with a furnace chamber in which are disposed a bottomless cold-wall crucible closed on the circumference for the production of the directedly solidified ingot of silicon, a system for the continues vertical drawing down of the ingot by means of a relative movement through a supporting body with a horizontal upper bearing surface at least substantially closing off the horizontal inside cross section of the cold-wall crucible and corresponding at least largely to the ingot cross section, and which has a heating system for heating the ingot material, wherein a) the supporting body is configured as a hollow metal cooling body, b) a plane-parallel seed body of silicon is placed on the cooling body and its crystal structure is selected from the coarsely crystalline to monocrystalline group, c) in the furnace chamber a forehearth is disposed for melting lump silicon and for holding a molten charge of silicon, d) the heating system is at least one electron beam gun, e) the forehearth has an overflow whose lip terminates above the inside cross section of the cold-wall crucible, f) the cooling body can be lifted to the vicinity of the top edge of the coldwall crucible, and that g) the at least one electron beam gun is associated with the forehearth and the cold-wall crucible for the heating of the silicon in the forehearth and in the cold-wall crucible.

14. A method for the oriented solidification of molten silicon to form an ingot in a bottomless crystallization chamber with a cooling body supporting the ingot, the cooling body being lowered by relative motion with respect to the crystallization chamber at a rate dependent on the additional feed of silicon and the solidification rate, a flat bottom surface of a silicon seed body with a columnar crystal structure being placed on top of a flat top surface of the cooling body, the seed body initially sealing the crystallization chamber off at least almost completely, a top surface of the seed body being melted by the molten silicon, whereupon the cooling body with the seed body and the already solidified part of ingot is removed by relative motion from the crystallization chamber, wherein     a) lump silicon is melted to form a silicon melt in a forehearth by electron-beam heating;

b) a cold crucible closed around its circumference is used as the crystallization chamber;

c) a silicon seed body of solid silicon with a structure selected from the group ranging from coarsely crystalline to monocrystalline is laid on the cooling body;

d) molten silicon from the forehearth is applied to this seed body and heated by an electron beam to fuse it to the top surface of the seed body, the cooling body being left uncooled at first, the cooling being turned on at least essentially at the same time that the relative motion between the cooling body and the cold crucible begins; and in that finally     e) the seed body, under continuous resupply of molten silicon from the forehearth and under continuation of the heating by the electron beam, is lowered by relative motion with respect to the cold crucible.

15. The method of claim 14 wherein the seed body and the cooling body are first located int he upper area of the cold crucible, wherein first a thin layer of molten silicon is poured onto the seed body from the forehearth, and wherein this layer is heated from above by an electron beam until it fuses with the seed body, whereupon additional molten silicon is supplied to the cold crucible from the forehearth.

16. The method of claim 14 wherein while the layer is being fused to the top surface of the seed body, the percentage of the electron-beam heating power being sent to the seed body is increased temporarily and then, after the seed body has been lowered, controlled in such a way that the vertical temperature gradient within the ingot is kept essentially constant in the range of the solid/liquid phase boundary throughout the entire solidification process.

17. A method for the oriented solidification of molten silicon to form an ingot in a bottomless crystallization chamber with a cooling body which supports the ingot, the cooling body being lowered by relative motion with respect to crystallization chamber at a rate dependent on the additional feed of silicon and the solidification rate, the flat bottom surface of a seed body with a columnar crystal structure being laid on a flat top surface of the cooling body, the seed body initially sealing the crystallization chamber off almost completely, the seed body having a top surface which is melted by the molten silicon, wherein the cooling body with the seed body and the already solidified part of the ingot is removed by relative motion from the crystallization chamber, wherein     a) a cold, water-cooled, slotted metal crucible is used as the crystallization chamber, which is surrounded by an induction coil;

b) the silicon melt is first adjusted by radiant heating from above to a temperature at which the silicon melt is coupled by its electrical conductivity directly to the induction coil;

c) a silicon seed body with a crystal structure selected from the group ranging from coarsely crystalline to monocrystalline is used; and     d) the cooling body is first left uncooled as the top surface of the seed body is melted, and the cooling is turned on at least at essentially the same time that the relative motion between the cooling body and the cold crucible begins, wherein the seed body has columnar crystals, the longest axes of which are at least essentially parallel to the axis of the crucible.

18. A method for the oriented solidification of molten silicon to form an ingot in a bottomless crystallization chamber with a cooling body, which supports the ingot, the cooling body being lowered by relative motion with respect to crystallization chamber at a rate dependent on the additional feed of silicon and the solidification rate, the flat bottom surface of a seed body with a columnar crystal structure being laid on a flat top surface of the cooling body, the seed body initially sealing the crystallization chamber off almost completely, the seed body having a top surface which is melted by the molten silicon, wherein the cooling body with the seed body and the already solidified part of the ingot is removed by relative motion from the crystallization chamber, wherein     a) a cold, water-cooled, slotted metal crucible is used as the crystallization chamber, which is surrounded by an induction coil;

b) the silicon melt is first adjusted by radiant heating from above to a temperature at which the silicon melt is coupled by its electrical conductivity directly to the induction coil;

c) a silicon seed body with a crystal structure selected from the group ranging from coarsely crystalline to monocrystalline is used; and     d) the cooling body is first left uncooled as the top surface of the seed body is melted, and the cooling is turned on at least at essentially the same time that the relative motion between the cooling body and the cold crucible begins, wherein the top and bottom surfaces of the seed body are plane-parallel cut surfaces, the average diameter of the columnar crystals being at least 10 mm over the entire top cut surface of the seed body.

19. The method of claim 18, wherein the seed body has columnar crystals, the longest axes of which are at least essentially parallel to the axis of the crucible.

20. The method of claim 18, wherein the seed body is 0.3–20 mm thick.

21. A method for the oriented solidification of molten silicon to form an ingot in a bottomless crystallization chamber with a cooling body, which supports the ingot, the cooling body being lowered by relative motion with respect to crystallization chamber at a rate dependent on the additional feed of silicon and the solidification rate, the flat bottom surface of a seed body with a columnar crystal structure being laid on a flat top surface of the cooling body, the seed body initially sealing the crystallization chamber off almost completely, the seed body having a top surface which is melted by the molten silicon, wherein the cooling body with the seed body and the already solidified part of the ingot is removed by relative motion from the crystallization chamber, wherein     a) a cold, water-cooled, slotted metal crucible is used as the crystallization chamber, which is surrounded by an induction coil;

b) the silicon melt is first adjusted by radiant heating from above to a temperature at which the silicon melt is coupled by its electrical conductivity directly to the induction coil;

c) a silicon seed body with a crystal structure selected from the group ranging from coarsely crystalline to monocrystalline is used; and d) the cooling body is first left uncooled as the top surface of the seed body is melted, and the cooling is turned on at least at essentially the same time that the relative motion between the cooling body and the cold crucible begins, wherein a gaseous coolant is used to cool the cooling body.

* * * * *